(12) United States Patent
Klebanoff et al.

(10) Patent No.: US 6,664,554 B2
(45) Date of Patent: Dec. 16, 2003

(54) SELF-CLEANING OPTIC FOR EXTREME ULTRAVIOLET LITHOGRAPHY

(75) Inventors: Leonard E. Klebanoff, Dublin, CA (US); Richard H. Stulen, Livermore, CA (US)

(73) Assignee: EUV LLC, Santa Clara, CA (US)

( * ) Notice: Subject to any disclaimer, the term of this patent is extended or adjusted under 35 U.S.C. 154(b) by 253 days.

(21) Appl. No.: 09/754,869

(22) Filed: Jan. 3, 2001

(65) Prior Publication Data

US 2002/0084425 A1 Jul. 4, 2002

(51) Int. Cl.[7] .................................................. F21V 9/06
(52) U.S. Cl. ...................................... 250/505.1; 359/361
(58) Field of Search ........................... 250/505, 505.1; 359/359, 360, 361; 427/162; 428/641, 450

(56) References Cited

U.S. PATENT DOCUMENTS

| 5,928,817 A | * | 7/1999 | Yan et al. ................... 430/5 |
|---|---|---|---|
| 5,958,605 A |   | 9/1999 | Montcalm et al. .......... 428/627 |
| 6,048,652 A | * | 4/2000 | Nguyen et al. ................ 430/5 |
| 6,228,512 B1 | * | 5/2001 | Bajt et al. .................... 428/635 |
| 6,309,705 B1 | * | 10/2001 | Montcalm et al. ........ 427/376.2 |
| 6,333,961 B1 | * | 12/2001 | Murakami ..................... 378/35 |
| 6,396,900 B1 | * | 5/2002 | Barbee et al. ................. 378/84 |
| 6,449,086 B1 | * | 9/2002 | Singh ........................... 359/361 |

\* cited by examiner

Primary Examiner—Jack Berman
Assistant Examiner—Johnnie L Smith, II
(74) Attorney, Agent, or Firm—D. A. Nissen

(57) ABSTRACT

A multilayer reflective optic or mirror for lithographic applications, and particularly extreme ultraviolet (EUV) lithography, having a surface or "capping" layer which in combination with incident radiation and gaseous molecular species such as $O_2$, $H_2$, $H_2O$ provides for continuous cleaning of carbon deposits from the optic surface. The metal capping layer is required to be oxidation resistant and capable of transmitting at least 90% of incident EUV radiation. Materials for the capping layer include Ru, Rh, Pd, Ir, Pt and Au and combinations thereof.

18 Claims, 3 Drawing Sheets

SELF-CLEANING OPTIC FOR EXTREME ULTRAVIOLET LITHOGRAPHY

STATEMENT OF GOVERNMENT INTEREST

This invention was made with Government support under contract no. DE-AC04-94AL85000 awarded by the U.S. Department of Energy to Sandia Corporation. The Government has certain rights in the invention.

CROSS-REFERENCE TO RELATED APPLICATIONS

Not applicable.

BACKGROUND OF THE INVENTION

This invention pertains generally to a surface or "capping" layer for optics used for lithographic applications, and particularly for extreme ultraviolet lithography. The surface or "capping" layer disposed on an optic, such as a multilayer mirror, acts in combination with molecular species such as $O_2$, $H_2$ and $H_2O$ in the presence of energetic radiation to maintain the optic surface substantially free of carbon contamination. The capping layer is such that it also protects the surface from oxidation or oxidative degradation.

The demand for circuitry of increasing density and higher resolution features and thus, for smaller feature sizes has inexorably driven the wavelength of radiation needed to produce the desired pattern to ever-shorter wavelengths. Extreme ultraviolet (EUV) radiation, i.e., radiation in the wavelength range of 3–15 nm, is strongly attenuated by conventional transmission optics and thus lithographic projection methods that use optics that reflect rather than transmit light become necessary. At the present time, the reflective optics and masks used for extreme ultraviolet lithography (EUVL) are based on a Mo/Si multi-layer structure with the topmost layer consisting of about 40 Å of Si.

Hydrocarbon molecules and water vapor are ubiquitous in the photolithographic apparatus (stepper) used for EUVL. They are present in the background environment of the stepper and can arise from oils used in vacuum pumps that maintain the required low pressure atmosphere within the stepper as well as other organic materials within the stepper environment such as photoresist materials and cabling. Water is adsorbed on all surfaces and is very difficult to remove in spite of the use of rigorous vacuum baking techniques. EUV radiation is energetic enough to cause the decomposition of water molecules adsorbed on or proximate to a surface to produce hydrogen and reactive oxygen species that can attack, degrade, or otherwise contaminate optical surfaces. EUV-induced dissociation of organic materials can cause the surfaces of multi-layer Mo/Si optics and masks to become contaminated with carbon. These carbon coatings gradually degrade the performance of the coated component, e.g., reduce the reflectivity of optical surfaces. This phenomenon is shown graphically by curve 100 in FIG. 1 where relative reflectivity ($R/R_0$) is plotted against exposure time for a multilayer Mo/Si mirror exposed to a hydrocarbon vapor (neoprene) in a flux of EUV radiation. It can be seen that after 3 hrs. exposure there is an unacceptable 7% loss in reflectivity.

A method that can be used for removing carbon contamination is the use of oxygen-containing molecules, such as $H_2O$ and $O_2$ which in the presence of energetic radiation can form reactive chemical species that can react with carbon contamination to form volatile carbon compounds, such as CO and $CO_2$, that can be pumped away. While the oxidative treatment works to remove carbon contamination, once the carbon layer is removed from the surface of the Mo/Si multi-layer optic structure, the reactive oxygen species can oxidize the underlying terminating Si surface layer, forming silicon oxides (generally $SiO_2$). Oxygen is a strong absorber of EUV thus, oxidation of the Si-terminated Mo/Si optic would cause irreversible degradation of the reflective ability of these optics, such as that shown in FIG. 1.

Recognizing the degradation in performance of optical components associated with interactions with environmental contaminants, various solutions have been proposed. By way of example, gas plasmas have been found to be effective for removing surface contaminants, and in particular carbon contamination, such as disclosed in U.S. Pat. No. 5,814,156 to Elliot, U.S. Pat. No. 5,312,519 to Sakai et al., and by M üller et al., *Rev. Sci. Instrum.*, 63, 1428–1431, 1992. However, being unable to precisely control the extent of reaction, unwanted and harmful reactions with system components, as discussed above, can take place.

U.S. Pat. No. 5,958,605 to Montcalm et al. discloses an overcoat (or "capping") layer applied to the surface of a Mo/Si multilayer mirror structure that resists oxidation. In order that the reflectivity of the multilayer optic is not degraded by the overcoat layer, it is necessary to tailor both the thickness of the overcoat layer and the reflecting layer that lies directly beneath it such that the beams reflected from these layers are in phase and add constructively. This can require a complex series of calculations to optimize the thickness of either the overcoat layer, the thickness of the layer beneath the overcoat, or both. Moreover, the overcoat layer of Montcalm does not act to prevent carbon contamination of the multilayer optic.

The requirements for components for EUV lithography are such that any degradation in reflectivity of multilayer optics, such as would be caused by the formation of a carbon film, is unacceptable. Present methods for removing carbon by oxidation are difficult to apply in the environment of an EUV lithography system and are often harmful to optical components. Oxidation barriers, such as described above, are difficult to use because of reflectivity considerations. An oxidation resistant layer that could be disposed on top of a terminal Si layer in an multilayer Mo/Si mirror structure, that would transmit substantially all the incident EUV radiation, and would actively prevent or minimize carbon contamination of the multilayer Mo/Si mirror surface would provide the best approach for solving this problem.

SUMMARY OF THE INVENTION

The present invention is directed generally to a self-cleaning optic, whereby a metal surface or "capping" layer, in combination with gaseous reactants such as $O_2$, $H_2$, $H_2O$ and combinations thereof, provides for continuous cleaning of carbon deposits from the surface of the multilayer reflective optics used for lithographic applications and particularly for extreme ultraviolet lithography (EUVL). The gaseous species can be adventitious in the environment of the optic or added deliberately. The metal used for the capping layer is required to have the ability to transmit substantially all (>90%) of the incident EUV radiation to the underlying multilayer mirror structure, be resistant to oxidation, particularly in the presence of EUV radiation, and provide for catalytic dissociation of the gaseous reactants. The invention is further directed to methods of making the self-cleaning optic.

Currently, the reflective optics and masks used for EUVL are based on a Mo/Si multi-layer structure with the topmost layer consisting of about 40 Å of Si. In this invention, a thin (≈5–400 Å and preferably 5–10 Å) metal capping layer is deposited on top of the terminating Si layer. In some cases, it can be desirable to interpose a binding layer between the terminating Si layer and the capping layer to promote adhesion of the capping layer. However, it is necessary that this binding layer be thin (≈1–3 Å) so as not to affect materially transmission of incident radiation. A small pressure (≈$10^{-4-10-8}$ Torr) of one or more of the aforementioned reactant gas species in the environment of the capped multilayer optic, and irradiated by EUV, will generate reactive atomic species which, in turn, will react with and remove any carbon contaminants deposited on the optic surface.

In addition to oxidizing species that can be produced by the decomposition of $O_2$ and $H_2O$ by EUV radiation, atomic hydrogen can also be used to remove carbon from surfaces as $CH_4$, for example. Thus, it is desirable that the metal comprising the capping layer provide a catalytic surface for the binding and dissociation of molecular hydrogen to form atomic hydrogen. Metals that are suitable for the capping layer include Ru, Rh, Pd, Ir, Pt, and Au and combinations thereof.

DETAILED DESCRIPTION OF THE INVENTION

The present invention is directed to the use of a metal surface or "capping" layer for multilayer mirror structures, and particularly Mo/Si multilayer mirrors that, in combination with gaseous reactants and incident radiation, and particularly extreme ultraviolet (EUV) radiation, provide for continuous cleaning of carbon deposits from the surface.

Figure 2:
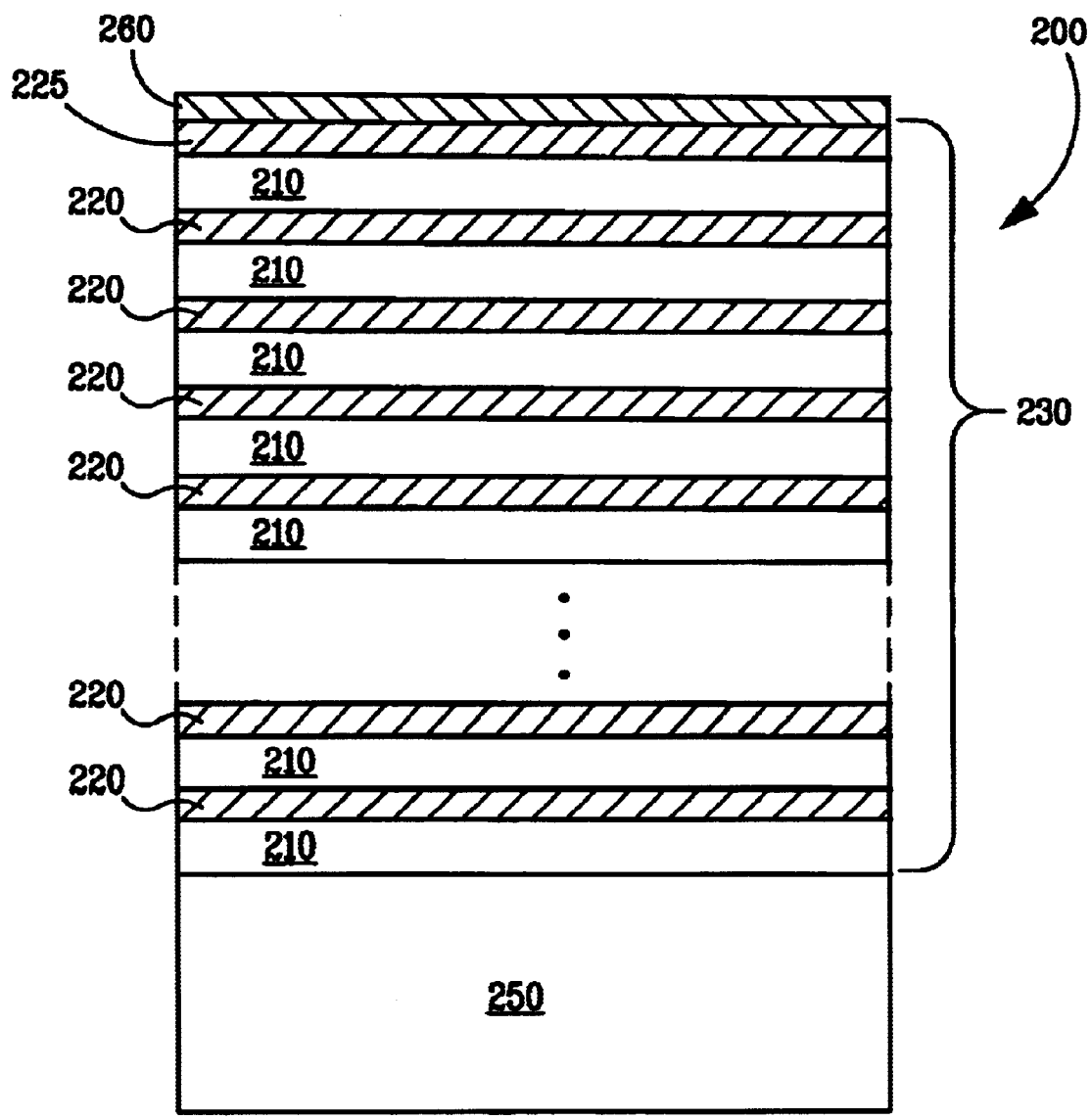
FIG. 2 is a schematic diagram of the structure of a multilayer mirror.

FIG. 2, which is used to illustrate and exemplify the invention, shows a typical multilayer reflective mirror structure 200 used for EUV applications. In one embodiment, multiple alternating layers of Mo 210 and Si 220 comprise the multilayer coating 230 that is deposited onto a substrate 250. This particular configuration is used only for purposes of illustration, other structures are possible, such as non-periodic stacks, multilayer stacks with other materials, or more than two materials. A metal surface or capping layer 260, that can be from 5–400 Å thick and preferably from 5–10 Å thick, is deposited onto the terminating Si layer 225. Layer 260 is comprised of a metal or metal alloy that is not only oxidation resistant but also can bind and catalyze the dissociation of gaseous reactants to produce species that can react with and gasify carbon deposits in the presence of EUV radiation. Layer 260 also possesses the ability to transmit at least 90%, and preferably greater than 98%, of the incident EUV radiation, i.e., radiation in the wavelength range of 3–15 nm, and particularly at about 13.4 nm. By way of example, a 10 Å Ru film will transmit at least about 98.5% of the incident radiation at a wavelength of 13.4 nm. Metals that are known to be both oxidation resistant and able to transmit substantially all incident EUV radiation include Rh, Ir, Pt, Pd, Ru and Au and combinations thereof.

Radiation having an energy equal to or greater than about 6 eV, such as that possessed by EUV radiation, can cause secondary electrons to be ejected from the capping layer. These secondary electrons can dissociate oxygen containing gases (such as $O_2$, $H_2O$, or air) present in the environment to produce reactive oxygen species. The reactive oxygen species can react with any carbon coating present on the surface of the metal capping layer as indicated by curve 120 of FIG. 1. Gaseous oxidizing reactants can be adventitious in the atmosphere or provided by admitting a small partial pressure (≈$10^{-4-10-8}$ Torr) of either or all of these oxygen containing gases into the environment of the multilayer mirror.

Figure 1:
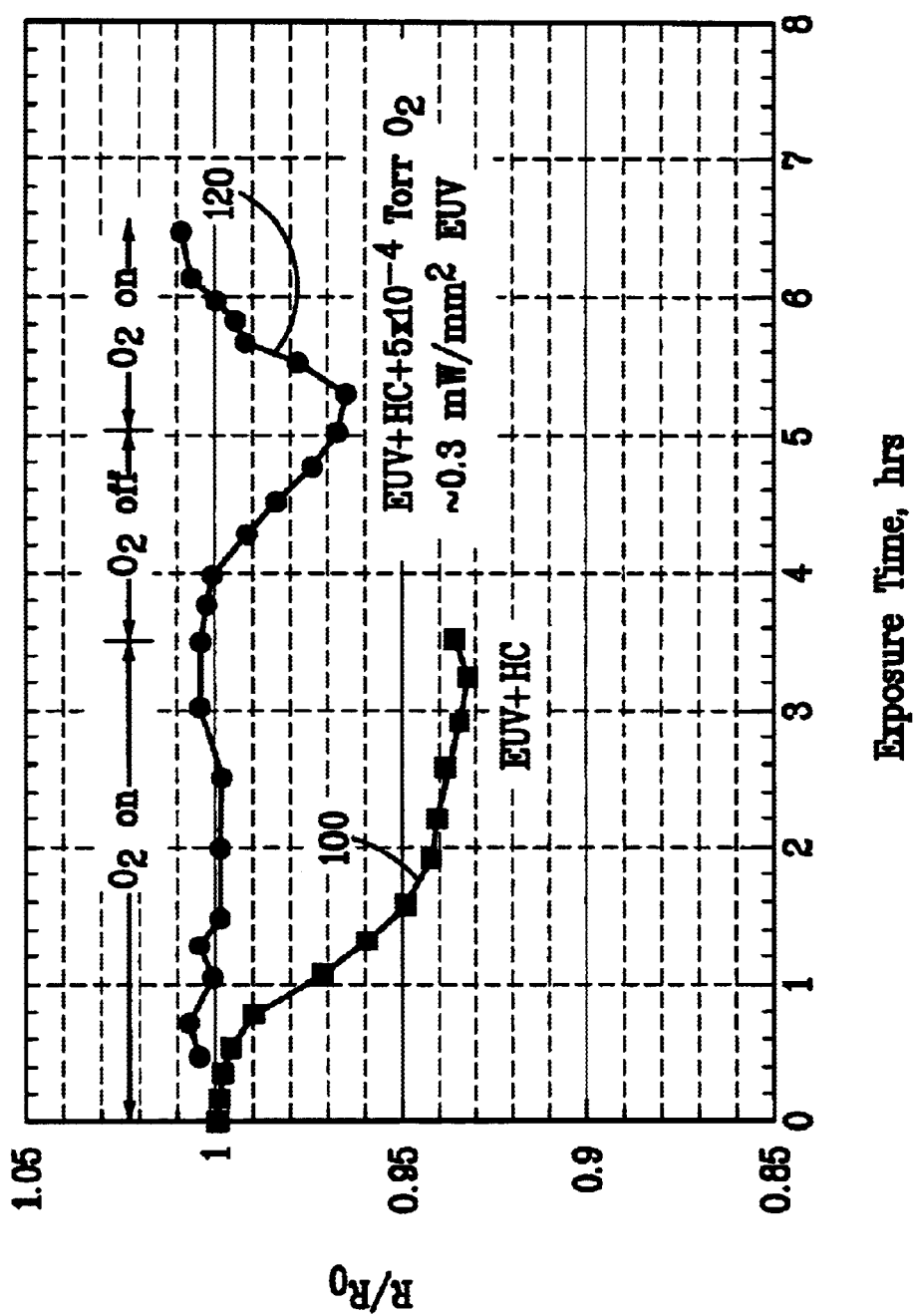
FIG. 1 shows changes in relative reflectivity of a Mo/Si mirror for a number of conditions.

Referring now to FIG. 1. As discussed above, curve 100 shows that the reflectivity of a Mo/Si multilayer mirror can be reduced as much as 7% by exposure to a hydrocarbon vapor in the presence of EUV radiation (≈0.3 mW/mm²) for about 3 hours. Curve 120 of FIG. 1, shows the effect on the reflectivity of a Mo/Si mirror exposed to a hydrocarbon (HC=neoprene) vapor in the presence of about $5\times10^{-4}$ Torr of an oxidizing reactant ($O_2$) and EUV radiation. In contrast to the marked change in reflectivity shown by curve 100, curve 120 shows no change in reflectivity indicating that any carbon, produced by radiation induced decomposition of the hydrocarbon material deposited on the mirror surface, was immediately oxidized away. Subsequently, the oxidizing reactant was removed (3–5 hrs) and the reflectivity began to fall as a carbon deposit began to build up on the mirror surface. The oxidizing reactant was again introduced (>5 hrs.) and reflectivity began to rise indicating oxidative removal of the deposited carbon.

Figure 3A:
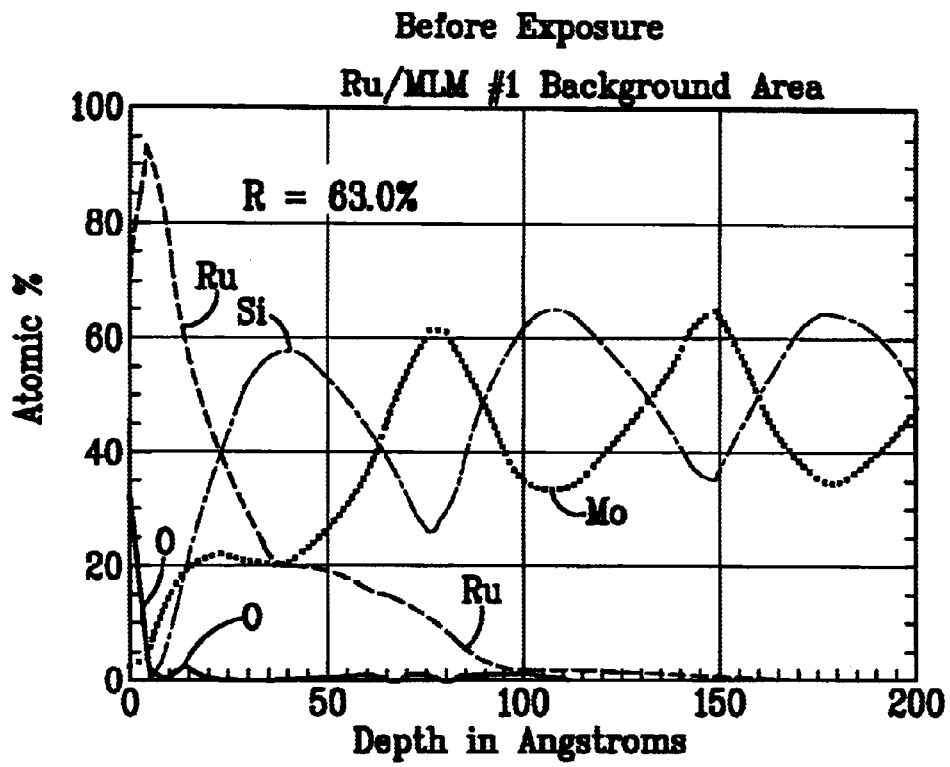
FIG. 3 shows the effect of $H_2O$ exposure, in the presence of electron radiation, on oxidation and reflectivity of a Ru-capped Mo/Si multilayer mirror.
Figure 3B:
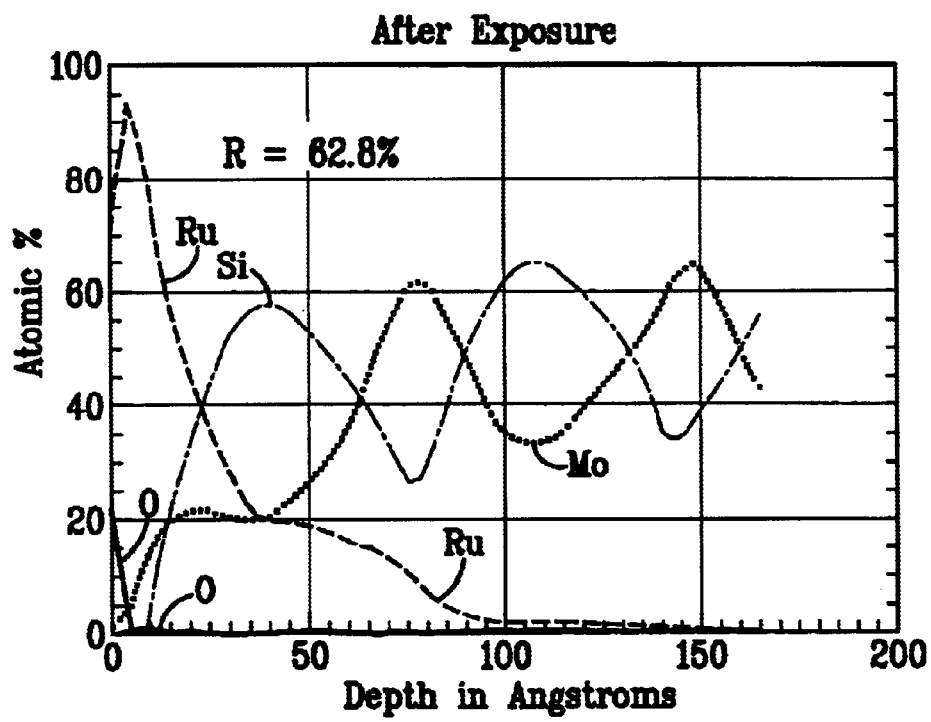

In addition to transmitting greater than about 90% of the incident EUV radiation, the metal capping layer of the invention must not only be capable of promoting formation of reactive oxygen species from the oxidizing reactant that will react with carbon but also be resistant to the aggressive oxidation conditions associated with these reactive oxygen species. FIGS. 3a and 3b show sputter Auger depth profile analysis of the interface between a 20 Å thick Ru metal layer capping the Mo surface of a Mo/Si multilayer structure both before (3a) and after (3b) exposure to $5\times10^{-7}$ Torr water vapor for 4.5 hrs. During exposure, the Ru capped Mo surface was irradiated with a flux of 2 kV electrons at a current density of 5 μA/cm² to simulate exposure to EUV radiation. Because EUV radiation interacts with the Mo/Si mirror and its capping layer to generate secondary electrons that provide for dissociation of reactant gas species, an electron flux can be used to simulate easily and accurately the reactive conditions produced by EUV radiation. The Ru layer itself can also promote the dissociation of molecular $H_2O$ into reactive oxygen atoms.

The Auger sputter profiles shown in FIGS. 3a and 3b are practically identical showing that both the Ru capping layer and the underlying terminating Mo surface of the multilayer mirror were not oxidized by the exposure conditions. Moreover, the EUV reflectivity (R) of the multilayer mirror remained practically unchanged, having a value of 63.0% before exposure and 62.8% after, a difference that is within measurement error.

Another preferred metal for the capping layer is Pd. As has been discussed above, EUV radiation-induced decomposition of molecules present in environment (water and residual hydrocarbon material) can cause the formation of hydrogen as well as reactive oxygen species. It is well known in the art, that Pd metal can adsorb hydrogen molecules and catalyze the dissociation of the adsorbed hydrogen to form chemically active atomic hydrogen. As was the case with the reactive oxygen species discussed above, atomic hydrogen can react with the carbon deposits on surfaces to form volatile species such as methane ($CH_4$), thereby removing the carbon deposit.

The metal capping layers can be applied by any means known to the art, such as by magnetron sputtering or e-beam evaporation. In some instances, particularly when the capping layer thickness is greater than about 100 Å, it can be desirable to interpose a thin Cr, Mo, or Ti metal layer between the top surface of the multilayer mirror and the metal capping layer. The Cr, Mo, or Ti metal binding layer, that can be about 1–3 Å thick, can improve adherence of the capping layer.

In summary, by covering a surface, that can be the surface of an optic and particularly the surface of a multilayer mirror, with a metal capping layer that is both substantially transparent to radiation, and particularly to EUV radiation, and oxidation resistant, in combination with incident radiation and small amounts of a reactant gas such as $H_2O$, $O_2$ or $H_2$, which can be adventitiously present or added deliberately, it is possible to provide a surface which is not only resistant to oxidation but is also continuously cleaned of carbon deposits.

We claim:

1. A self-cleaning reflective optic, comprising:
   a metal disposed on the surface of the optic, wherein said metal protects the optic surface against oxidation and transmits substantially all incident radiation to the underlying optic surface;
   incident radiation; and
   least one gaseous reactant, wherein the gaseous reactant is provided at a pressure of at least $10^{-8}$ Torr and wherein the gaseous reactant is oxygen, water vapor, air or hydrogen and combinations thereof.

2. The reflective optic of claim 1, wherein the incident radiation is extreme ultraviolet radiation.

3. The reflective optic of claim 1, wherein the optic comprises a multilayer mirror.

4. The reflective optic of claim 3, wherein the reflective optic comprises a plurality of layers, each layer comprising a first layer of molybdenum and a second layer of silicon.

5. The reflective optic of claim 1, wherein the metal transmits greater than 98% of the incident extreme ultraviolet radiation.

6. The reflective optic of claim 5, wherein the metal is ruthenium.

7. The reflective optic of claim 1, wherein the metal is rhodium, platinum, iridium, palladium, or gold and combinations thereof.

8. The reflective optic of claim 1, wherein the metal has a thickness ranging from about 5 Å to about 400 Å.

9. The reflective optic of claim 1, further including a metal layer interposed between the surface of the reflective optic and the capping layer.

10. The reflective optic of claim 9, wherein the metal is chromium, molybdenum, or titanium.

11. A method for maintaining the surface of a reflective optic designed for use in extreme ultraviolet applications substantially free of carbon contamination, comprising the steps of:
    providing a reflective optic;
    coating the surface of the reflective optic with a metal capping layer, wherein the metal capping layer is protective against oxidation and is capable of transmitting greater than about 90% of incident extreme ultraviolet radiation;
    supplying a reactive gas wherein the reactive gas is oxygen, water vapor, air or hydrogen and combinations thereof, and wherein the pressure of the reactive gas is at least about $10^{-8}$ Torr; and
    exposing the coated reflective optic and reactive gas to extreme ultraviolet radiation.

12. The method of claim 11, wherein said step of coating is by magnetron sputtering or e-beam evaporation.

13. The method of claim 11, wherein the reflective optic comprises a multilayer mirror.

14. The method of claim 13, wherein the reflective optic comprises a plurality of layers, each layer comprising a first layer of molybdenum and a second layer of silicon.

15. The method of claim 11, wherein the metal transmits greater than 98% of the incident extreme ultraviolet radiation.

16. The method of claim 15, wherein the metal is ruthenium.

17. The method of claim 11, wherein the metal is rhodium, platinum, iridium, palladium, or gold and combinations thereof.

18. The method of claim 11, wherein the metal capping layer has a thickness ranging from about 5 Å to about 400 Å.

* * * * *